United States Patent [19]

van Heelsbergen et al.

[11] Patent Number: 5,381,094
[45] Date of Patent: Jan. 10, 1995

[54] PHANTOM FOR SIMULATING THE ELECTRIC LOADING IN A MAGNETIC RESONANCE APPARATUS

[75] Inventors: Teunis R. van Heelsbergen; Antonius M. C. Tinus, both of Eindhoven, Netherlands

[73] Assignee: U.S. Phillips Corporation, New York, N.Y.

[21] Appl. No.: 79,433

[22] Filed: Jun. 17, 1993

[30] Foreign Application Priority Data

Jun. 22, 1992 [EP] European Pat. Off. ......... 92201816.3

[51] Int. Cl.⁶ ............................................. G01R 33/20
[52] U.S. Cl. .................................................... 324/318
[58] Field of Search ............... 324/300, 307, 309, 310, 324/308, 311, 312, 313, 314, 318, 322

[56] References Cited

U.S. PATENT DOCUMENTS 4,665,368  5/1987  Sugiyama et al. ................. 324/318
4,789,830  12/1988  Stokar ................................. 324/308

OTHER PUBLICATIONS

"A Signal-to-Noise Calibration Procedure for NMR Imaging Systems", by W. A. Edelstein et al, 1984 Am. Assoc. Phys. Med., pp. 180–185.

The British Journal of Radiology, 59, pp. 1031–1034.

*Primary Examiner*—Michael J. Tokar
*Attorney, Agent, or Firm*—Edward Blocker; Bernard Franzblau

[57] ABSTRACT

A phantom which simulates the electric load in a magnetic resonance apparatus includes a loop which can be inductively coupled to the RF coil of the MRI apparatus and which has a predetermined electric resistance. The phantom has a simple, rugged and light construction in that the loop includes a member having a shape that corresponds mainly to the shape of the RF coil and which is made of a solid material having a specific electric resistance and a thickness chosen so that the square resistance measured on a surface of the member is between predetermined limits. The member is preferably formed as a layer of an electric resistive material provided on an electrically insulating support having a suitably shaped surface.

16 Claims, 2 Drawing Sheets

PHANTOM FOR SIMULATING THE ELECTRIC LOADING IN A MAGNETIC RESONANCE APPARATUS

BACKGROUND OF THE INVENTION

This invention relates to a phantom for simulating the electric load constituted by an object to be examined for an RF coil of a magnetic resonance apparatus, comprising a loop which can be inductively coupled to the RF coil and in which a predetermined electric resistance is included.

Examples of such a phantom (object simulator) are described in The British Journal of Radiology, 59, pages 1031-1034. One feasible embodiment of the phantom is a ring-shaped vessel filled with, for example, a saline solution. It is a drawback of such a container that it is bulky, heavy and vulnerable. Another solution disclosed in the cited article consists of a closed loop which can be inductively coupled to the RF coil and which comprises, for example, a coil, a resistor and a capacitor. This solution is comparatively expensive, the more so because the resistor and the capacitor should preferably be variable so as to enable adaptation of the phantom to various circumstances.

SUMMARY OF THE INVENTION

It is an object of the invention to provide a phantom of the kind set forth which is inexpensive and light and has a simple construction. To achieve this, the phantom in accordance with the invention is characterized in that the loop includes a member whose shape corresponds mainly to the shape of the RF coil and which is made of a solid material having a specific electric resistance and a thickness chosen so that the square resistance measured on a surface of the member is between predetermined limits.

The square resistance is the electric resistance measured between two oppositely situated sides of a square part of a surface. This resistance is independent of the dimensions of the square. When the member is positioned in the vicinity of an RF coil, electric eddy currents can be induced in the wall of the body. As a result, the RF coil is loaded by a resistance whose value depends on said square resistance of the wall of the member.

The member may be formed as a self-supporting member of a material having a suitable specific resistance. However, the member is preferably formed as a layer of an electric resistive material provided on an electrically insulating support having a suitably shaped surface. The support may be made of a suitable synthetic material, for example, PVC, and the resistive layer may be formed, for example, by the application of a layer of electrically conductive lacquer. Lacquers having a given specific resistance are commercially available. When such a lacquer is provided in a given thickness on the support, a member having a predetermined square resistance is obtained. This resistance may be chosen so that the loading of the RF coil is too high. In that case the load can be reduced to the desired value by removing material from the wall of the support, for example, by scratching off a part of the layer of lacquer or by dissolving it by means of a suitable solvent.

A further preferred embodiment of the phantom in accordance with the invention is characterized in that on the surface of the member there is provided at least one strip-shaped additional element which is made of a solid material having a predetermined specific resistance. In this embodiment the member is formed so that the square resistance is initially too high so that the loading of the RF coil is too small. The effective square resistance is adjusted to the desired value by application of one or more of the additional elements.

When the RF coil is a surface coil, the member is preferably shaped as a flat plate. A phantom which is particularly suitable for cylindrical RF coils is characterized in that the member is shaped as a hollow cylinder, the additional elements being shaped as a ring having a circumference which corresponds substantially to that of the cylinder and a height which is less than that of the cylinder. Each application of an additional element then reduces the effective square resistance of an annular part of the cylinder wall by an amount which is dependent on the resistance of the relevant additional element. A further embodiment is characterized in that each additional element is formed as a layer of an electric resistive material provided on a strip-shaped, flexible support of an electrically insulating material. The resistance of the additional element can then be readily changed by cutting the strip to a desired width prior to its application to the surface of the member.

BRIEF DESCRIPTION OF THE DRAWINGS

These and other aspects of the invention will be described in detail hereinafter with reference to the accompanying drawing, in which.

DESCRIPTION OF THE PREFERRED EMBODIMENTS

Figure 1:
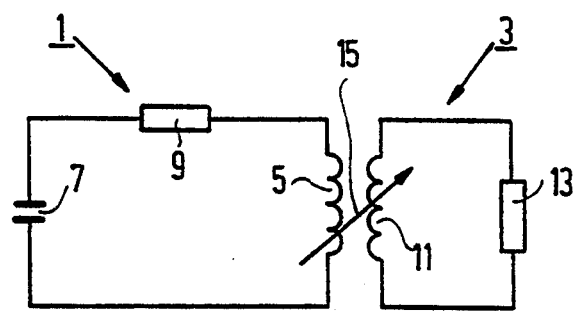
FIG. 1 shows a circuit diagram of an RF coil of a magnetic resonance apparatus which is inductively coupled to a phantom in accordance with the invention.

FIG. 1 shows an electric equivalent diagram of an RF coil 1 which is inductively coupled to a phantom 3. The RF coil 1 is equivalent to a loop consisting of a series connection of a coil 5, a capacitor 7 arid a resistor 9 which represents the electric resistance of the conductors constituting the RF coil. The phantom 3 is equivalent to a loop comprising a coil 11 and a resistor 13. The phantom 3 is arranged in the vicinity of the RF coil 1 (in the case of a cylindrical RF coil, for example, in a space enclosed by the RF coil), so that the coils 5 and 11 are inductively coupled to one another as denoted by an arrow 15. As a result of this coupling, the resistance 9 in the RF coil 1 is increased by an amount which is dependent on the value of the resistance 13. The same effect occurs when the RF coil is moved to the vicinity of an object to be examined in which eddy currents can occur, for example, a patient. As a result, the quality of the loop representing the RF coil is reduced.

Figure 2:
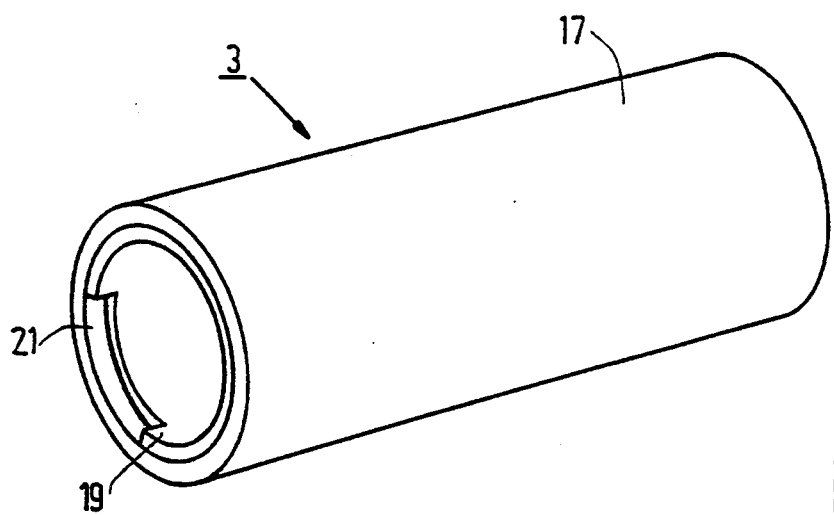
FIG. 2 is a perspective view of a first embodiment of a phantom in accordance with the invention.

FIG. 2 is a perspective view of a first embodiment of the phantom 3. It is formed by a support 17 in the form of a hollow cylinder of an electrically insulating material, for example PVC, the inner surface of which is covered by a layer of an electric resistive material 19 which, evidently, is also shaped as a hollow cylinder, thus constituting a member having mainly the same shape as the RF coil. This layer can be provided, for example, by vapour deposition or silk screening. A very simple and effective method for applying a layer 19, however, is to cover the inner surface with a layer of lacquer which contains material of a predetermined specific electric resistance and which forms a layer of solid resistive material after drying. Lacquers of this kind are commercially available. An example in this respect is Electrodag 5513 marketed by Acheson.

Figure 3:
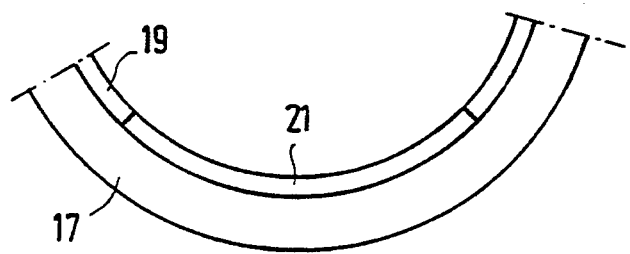
FIG. 3 is an axial view of a part of the phantom shown in FIG. 2.

The electric square resistance measured on the cylinder surface depends not only on the composition of the layer 19 but also on the dimensions of the support and the thickness of the layer. An easy method of achieving exactly the desired resistance is to apply a layer 19 which is slightly too thick, and to remove a part of the layer at a later stage. This part is denoted by the reference 21 in FIG. 2. Removal can be effected, for example, by scratching off the lacquer locally or by dissolving it by means of a suitable solvent. FIG. 3 is a partial axial view, at an increased scale, of the left-hand end of the phantom shown in FIG. 2. This Figure clearly shows the layer 19 with the removed pan 21.

Figure 4:
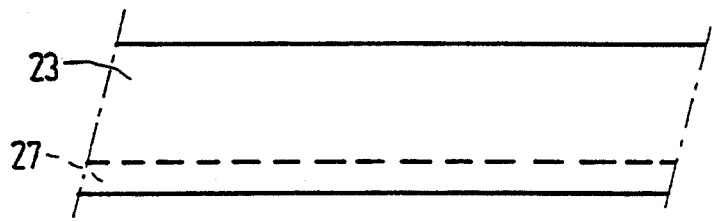
FIG. 4 is a partial view of a part of a second embodiment of the phantom in accordance with the invention.

Another method of adjusting the resistance of the phantom to a desired value is to provide a layer 19 which is slightly too thin, after which an additional element is arranged on the cylinder surface in order to achieve a local decrease of the effective square resistance. FIG. 4 shows such an embodiment. The additional element 23 thereof consists of a flexible strip made of a solid material having a predetermined specific resistance. This strip may consist entirely of resistive material, but is preferably formed as a layer of a resistive material provided on a flexible, strip-shaped substrate of an electrically insulating material. This construction is, therefore, analogous to the construction of the phantom 3 described with reference to FIG. 2. The additional element 23 may have the same square resistance as the layer 19. However, it is alternatively possible to choose a material having a very low specific resistance for the additional element, for example, copper. The additional element 23 is intended to be mounted on the surface of the resistive layer 19. Depending on the square resistance of the additional element 23, the eddy currents generated in the relevant pan of the layer 19 are then increased by a given amount (i.e. the loop quality Q of the phantom is decreased) so that the loading of the RF coil increases. Q is adjusted to the desired value as follows. First, the Q of the cylinder is measured without additional elements. This Q is always too high. Subsequently, a strip which brings the Q to approximately the desired value is chosen from a stock of strips having different square resistances. Generally speaking, the Q will then be slightly too low. By cutting the strip to the correct width or length, an additional element can be formed whereby the desired value of Q is obtained exactly. To this end, for example, an edge strip 27 is cut off.

Figure 5:
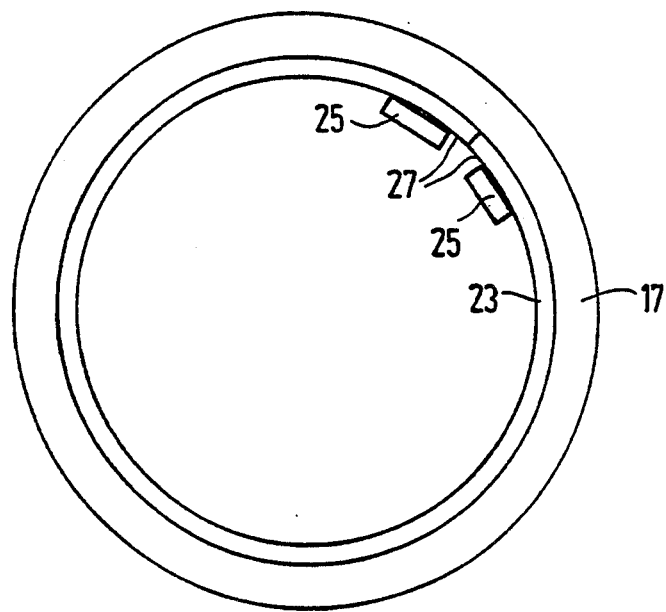
FIG. 5 is an axial view of the second embodiment.

The additional element 23 can be provided on the layer 19 so that it extends over a pan of the cylinder circumference, analogous to the pan 21 shown in FIGS. 2 and 3. However, the length of the short-circuit element is preferably chosen so that the additional element extends over the entire circumference of the cylinder so that the loading of the RF coil is uniformly distributed over the circumference. After mounting on the support 17 with the layer 19, the additional element 23 is then shaped as a closed ring having a circumference which corresponds substantially to that of the cylinder and a height (dimension in the axial direction) which is smaller than that of the cylinder. This is shown in an end view in FIG. 5, which is analogous to that of FIG. 3. In order to ensure easy mounting of the additional element 23 on the support 17, the support is preferably provided with fixing means, for example, in the form of fingers 25 which extend in the axial direction, and underneath the free ends of which the additional element 23 can be slid.

Because the resistance of the phantom 3 can be very simply adjusted to a desired value in the manner described above, no severe requirements are imposed as regards the accuracy of deposition of the layer 19. The phantom can also be manufactured in a very simple and inexpensive manner. Evidently, the shape and the dimensions of the body can be adapted to any requirement. Instead of the straight circular cylinder shown in the Figures, any other cylindrical shape or, for example, the shape of a flat or curved plate can be chosen, depending on the shape of the RF coil for which the phantom is intended.

We claim:

1. A phantom for simulating an electric load constituted by an object to be examined by means of an RF coil having a shape and which is a part of a magnetic resonance apparatus, comprising a loop adapted to be inductively coupled to the RF coil and wherein the loop has a predetermined electric resistance, wherein the loop includes a member having a shape which corresponds mainly to the shape of the RF coil and which is made of a solid material having a specific electric resistance and a thickness chosen so that the square resistance measured on a surface of the member is between predetermined limits.

2. A phantom as claimed in claim 1, wherein the member is formed as a layer of an electric resistive material provided on an electrically insulating support having a surface shaped to correspond mainly to the shape of the RF coil.

3. A phantom as claimed in claim 1, wherein a surface of the member includes at least one strip-shaped additional element made of a solid material having a predetermined specific resistance.

4. A phantom as claimed in claim 3, wherein the member is shaped as a hollow cylinder and the additional element is shaped as a ring having a circumference which corresponds substantially to that of the cylinder and a height which is less than that of the cylinder.

5. A phantom as claimed in claim 4, wherein each additional element comprises a layer of an electric resistive material provided on a strip-shaped, flexible support of an electrically insulating material.

6. A phantom as claimed in claim 2, wherein a surface of the member includes at least one strip-shaped additional element made of a solid material having a predetermined specific resistance.

7. A phantom as claimed in claim 3, wherein each additional element comprises a layer of an electric resistive material provided on a strip-shaped, flexible support of an electrically insulating material.

8. A simulated electric load for an RF coil of a magnetic resonance apparatus, wherein said RF coil has a particular shape, said simulated electric load comprising:

an electric loop having an electric resistance and a coil by which the loop is adapted to be inductively coupled to the RF coil, wherein the loop includes a member having a shape which corresponds to the shape of the RF coil and comprising a material having a specific electric resistance and a thickness such that the square resistance measured on a surface of the member is between predetermined limits.

9. The simulated electric load as claimed in claim 8 wherein the member comprises a layer of an electric resistance material provided on an electrically insulating support having a surface shaped so as to correspond mainly to the shape of the RF coil.

10. The simulated electric load as claimed in claim 8 wherein a surface of the member includes at least one strip-shaped additional element made of a material having a predetermined specific resistance.

11. The simulated electric load as claimed in claim 10 wherein the member is shaped as a hollow cylinder and the additional element is shaped as a ring having a circumference which corresponds substantially to that of the cylinder and which is shorter than the cylinder.

12. The simulated electric load as claimed in claim 11 wherein the additional element comprises a layer of an electric resistance material provided on a strip-shaped, flexible support of an electric insulating material.

13. The simulated electric load as claimed in claim 10 wherein the additional element comprises a layer of an electric resistance material provided on a strip-shaped, flexible support of an electric insulating material.

14. The simulated electric load as claimed in claim 8 wherein the member comprises a hollow cylinder of an electric insulating material having an inner surface supporting a layer of electric resistance material.

15. The simulated electric load as claimed in claim 14 wherein said layer of electric resistance material comprises a layer of lacquer containing a material of predetermined specific electric resistance.

16. The simulated electric load as claimed in claim 14 wherein the electric square resistance is measured on the cylinder surface and is determined by the composition of said layer, the dimensions of the hollow cylinder and the thickness of the layer.

* * * * *